(12) United States Patent
Zhang (10) Patent No.: US 10,161,963 B2
(45) Date of Patent: Dec. 25, 2018

(54) ELECTRICAL CONTACT AND TESTING APPARATUS

(71) Applicant: Chaojiong Zhang, College Station, TX (US)

(72) Inventor: Chaojiong Zhang, College Station, TX (US)

( * ) Notice: Subject to any disclaimer, the term of this patent is extended or adjusted under 35 U.S.C. 154(b) by 385 days.

(21) Appl. No.: 15/200,342

(22) Filed: Jul. 1, 2016

(65) Prior Publication Data

US 2017/0052217 A1    Feb. 23, 2017

Related U.S. Application Data

(60) Provisional application No. 62/205,773, filed on Aug. 17, 2015, provisional application No. 62/206,873, filed on Aug. 19, 2015.

(51) Int. Cl.
*G01R 31/44* (2006.01)
*G01R 1/04* (2006.01)
*G01R 31/36* (2006.01)

(52) U.S. Cl.
CPC ....... *G01R 1/0416* (2013.01); *G01R 31/3627* (2013.01); *G01R 31/44* (2013.01); *G01R 31/3644* (2013.01)

(58) Field of Classification Search
CPC .............. G01R 31/362; G01R 31/3658; G01R 31/3679; G01R 31/3606; G01R 31/3651; G01R 31/3624; G01R 31/3627; G01R 31/3696; G01R 31/3648; G01R 31/3662; G01R 19/16542; G01R 31/44

USPC ........................ 324/434, 426, 437, 433, 754; 73/1.01-36, 132-147; 702/1-199

See application file for complete search history.

(56) References Cited

U.S. PATENT DOCUMENTS

| | | | | |
|---|---|---|---|---|
| 1,502,928 A | * | 7/1924 | Thompson | G01R 31/3627 324/432 |
| 3,609,525 A | * | 9/1971 | Clingenpeel | H01M 2/20 324/434 |
| 5,903,154 A | * | 5/1999 | Zhang | G01R 31/3696 324/437 |
| 5,966,014 A | * | 10/1999 | Zhang | G01R 31/36 324/426 |
| 6,291,972 B1 | | 9/2001 | Zhang | |
| 6,304,449 B1 | | 10/2001 | Zhang | |
| 6,696,850 B1 | | 2/2004 | Sanders | |
| 7,198,510 B2 | | 4/2007 | Bertness | |
| 7,256,593 B2 | | 8/2007 | Treibergs | |

(Continued)

*Primary Examiner* — Jermele M Hollington
*Assistant Examiner* — Taqi Nasir
(74) *Attorney, Agent, or Firm* — Stephen S. Hodgson (57) ABSTRACT

An electrical contact device includes a tubular element, a crown spring in the tubular element, a solid or hollow cylinder slideably received in the crown spring and a coil spring engaged with the cylinder for applying force while the cylinder is pressed against a test item and for returning the cylinder to a relaxed position. The crown spring holds the cylinder in the tubular element and allows the cylinder to slide back and forth while providing electrical connectivity between the cylinder and the tubular element. An electrical contact device includes a rod-shaped probe having a contact end and a contact sheet fixed to the probe, where the contact sheet has a plurality of prongs bent over the contact end of the probe for providing a plurality of contact points between the probe and a test item.

29 Claims, 4 Drawing Sheets

(56) References Cited

U.S. PATENT DOCUMENTS

| | | | |
|---|---|---|---|
| 7,362,118 B2 | 4/2008 | Henry et al. | |
| 7,545,159 B2 | 6/2009 | Winter | |
| 7,614,907 B2 * | 11/2009 | Zhang | H01R 13/33 |
| | | | 439/500 |
| 7,862,391 B2 | 1/2011 | Johnston et al. | |
| 8,232,767 B2 | 7/2012 | Oh et al. | |
| 8,487,581 B2 | 7/2013 | Tan et al. | |
| 8,710,856 B2 | 4/2014 | Swart et al. | |
| 8,736,273 B2 | 5/2014 | Stancu et al. | |
| 8,802,259 B2 * | 8/2014 | Lee | B60L 11/1879 |
| | | | 324/433 |
| 8,970,238 B2 * | 3/2015 | Garcia | G01R 1/06716 |
| | | | 324/437 |
| 9,274,157 B2 | 3/2016 | Bertness | |
| 9,312,575 B2 | 4/2016 | Stukenberg | |
| 2009/0214936 A1 * | 8/2009 | Yang | G01R 31/3696 |
| | | | 429/61 |
| 2013/0113494 A1 * | 5/2013 | Nishihara | H01M 10/482 |
| | | | 324/426 |
| 2014/0028320 A1 * | 1/2014 | Nakamura | G01R 31/362 |
| | | | 324/426 |
| 2014/0183770 A1 * | 7/2014 | Ziegler | G01N 27/041 |
| | | | 264/40.1 |

* cited by examiner

ELECTRICAL CONTACT AND TESTING APPARATUS

CROSS REFERENCE TO RELATED APPLICATIONS

Priority is claimed to this inventor's U.S. Provisional Patent Application Ser. Nos. 62/205,773, filed Aug. 17, 2015, and 62/206,873, filed Aug. 19, 2015, each of which is incorporated by reference.

BACKGROUND OF THE INVENTION

1. Field of the Invention

This invention pertains to an electrical contact apparatus and more particularly to an electrical contact apparatus for high-amperage current, which is particularly suitable for testing batteries.

2. Description of the Related Art

U.S. Pat. No. 5,966,014, which issued to Zhang et al. and which is incorporated by reference, describes an apparatus, a system and a method for testing a plurality of batteries for multiple operating specifications ("the '014 patent"). The '014 patent describes how a number of batteries can be loaded into trays and positioned between appropriate probes or contact assemblies for testing the batteries simultaneously. Firm contact is preferably made at a consistent location on the batteries, which is typically on a centerline axis for cylindrical batteries. The centerline axis is best to assure that there is no variation from battery to battery resultant from the point of contact by the probe assembly. High-quality, sure and certain contact should be obtained at both ends of each battery for an electric current that is required to be drawn from each battery for test purposes. A second probe assembly, preferably concentrically arranged, is used to test the cell voltage of the batteries. The voltage contact does not require the current-handling capability of the amperage or current probe. The '014 patent describes an apparatus that operates both the current and voltage probes in a manner such that they are properly aligned so that they contact jointly one terminal of a battery and provide a current signal and a voltage signal. The other terminal contacts or connects with a current return probe. The terminals are at opposite ends of a cylindrical battery, and the current and voltage probes are aligned so that they move vertically along a common line of travel.

The '014 patent describes a tray into which ten, one hundred or any number of batteries can be loaded for testing. The tray and a number of additional trays can be loaded into an electrical cabinet for testing all of the batteries. Each battery tray is loaded remote from the cabinet and is then inserted and captured between lower and upper contact assemblies. A cam can be rotated to move the battery tray into operative contact with the lower and upper contact assemblies. The lower contact assembly is constructed with a bottom plate that is aligned above and is raised by cam action. The lower contact assembly is guided so that a number of upstanding components on the top of it are properly aligned for movement into operative contact between voltage and current contacts and the batteries in the tray. The system is constructed so that there are separate current flow paths and separate voltage contacts for each particular battery undergoing tests. The current flow path is structurally heavy duty in comparison to the gauge or weight of metal in the voltage contacts. The current flowing in the voltage contacts is relatively small, but it is sufficient to provide an adequate voltage signal. The current flow rates differ by several orders of magnitude. The current in the voltage contacts may be in the microampere range.

The electrical cabinet described in the '014 patent includes an adjustable voltage and current power supply, which is connected at a selected terminal to form an output current that is applied to the batteries. The output of the power supply is measured by a volt meter connected to the power supply. The volt meter forms a measurement of the output or terminal voltage, which is recorded. Another volt meter measures the terminal voltage across the batteries. A battery circuit is formed, and current is directed through a load resistor. The current is measured and recorded. The current may have a transient start and then a steady state aspect. And after a period of time, it will also have a decay curve as the battery heats and the resistance changes as a result of internal resistance in the battery. A timing cycle for taking the sample takes these factors into account. At a given instant, the circuit is closed and made operative so that current flows through the load resistor. A signal is measured and recorded at a related time interval after the circuit is closed, which provides a measurement of battery current flow. Other parameters of the batteries can be measured in a similar fashion. Please review the '014 patent for additional information.

An important aspect of a battery testing machine is the electrical connection between a battery being tested and the electrical circuitry in the machine. U.S. Pat. No. 5,903,154 issued to Zhang et al, and is incorporated by reference ("the '154 patent"). The '154 patent addressed this issue and discloses a battery test contact assembly. Battery testing involves substantial current flows. The current flow is provided through a test circuit, which provides a load for the battery and a current source. Batteries are tested for quality by providing timed charging current and discharge current in typical tests. The quality of the electrical connection between the battery being tested and the electrical circuitry in the machine is affected by a spring force of a spring that forces a battery contact against a battery terminal. If the contact force is outside a desired range, false readings may be obtained because the contact is not sufficient to enable full current flow between the battery terminal and the battery contact.

The '154 patent disclosed a battery tester contact assembly having a pair of parallel upper and lower printed circuit boards (PCBs) spaced from one another by a set of typically four conductor rods. The conductor rods provide parallel current conductor paths. The spacing between the PCBs is adjustable to accommodate batteries of different lengths. The upper PCB has a connector, which has two terminals that connect to electrical test circuitry in the battery testing machine. The test circuitry provides a controlled resistance across the battery, which may range from very large to nearly zero so that the current flow can be tested. The test circuitry will typically include an ammeter. The test circuitry typically also features a current source to impose a charging current on the battery, which is especially important in testing rechargeable batteries. It may be necessary to test a rechargeable battery by providing a controlled discharge through a low resistance and then applying a charging current to the cell.

The PCBs can be rectangular, and the lower PCB is connected to the upper PCB by four electrically conductive rods located near the corners of the PCBs. The rods extend up through the lower PCB and are electrically connected to the lower PCB, preferably using solder to make the connections. The four rods are connected in parallel and have a common circuit connection through conductive material on each side of the lower PCB. The rods serve two purposes, namely electrical conduction and spacing between the upper and lower PCBs. The rods are preferably made of a quality conducting metal, such as copper or a copper alloy. The rods are fixed to the lower PCB, but are slidingly and electrically engaged with the upper PCB. The upper PCB has electrically conductive metal sleeves that are in electrical contact with a conductive material on the upper PCB and that receive the rods in a manner that allows movement to vary the spacing between the upper and lower PCBs and that ensure a good and reliable electrical connections between the rods and the sleeves and the upper PCB. The upper and lower PCBs have electrical contacts for engaging opposing terminals of cylindrical batteries. Other configurations are described in the '154 patent for batteries having a different shape.

The electrical contacts on the PCBs that engage the batteries preferably include a voltage probe located in the center of the positive terminal contact. When including a voltage probe, it is desirable to have two leads or conductors out of the positive battery terminal. One is obtained by a large footprint contact area against the positive battery terminal so that the current flow is directed through that. A second contact point to the positive terminal provides terminal voltage output through an appropriate conductor. A concentric construction can be used to provide two contacts, one with large surface area and the other with small surface area. Two conductors are used in the movable contact assembly, with one carrying the current and the other providing a voltage signal. Voltage is generally measured using an independent point of contact with the battery terminal in order to have a separate signal path for voltage measurements. Battery testing normally involves substantial momentary current flows through the current flow path connected with the battery. In contrast, the signal path for voltage measurements involves a small current flow, typically 1 microampere or less, depending on the quality and nature of the voltage measuring circuit. FIGS. 4A, 4B and 5 in the '014 patent and the description of those figures show how separate voltage and current flow paths were achieved in battery testing according to the '014 and '154 patents (U.S. Pat. Nos. 5,966,014 and 5,903,154, respectively). Please review the '014 and '154 patents for additional information.

The contact assembly of the '154 patent provided appropriate contact to the battery through the use of a movable contact. That movable contact came into abutting contact with the battery terminal at a plurality of tines or prongs. For most low current applications, the tine contact structure provides adequate contact between the terminal and the contact. For high current applications, however, such as for example 100 amps or higher, such a contact presents a high resistance to current flow between the terminal and the contact, resulting in high temperatures, which is undesirable. U.S. Pat. No. 7,614,907, which was issued to Zhang and which is incorporated by reference, discloses a contact terminal with a self-adjusting contact surface that is suitable for high current applications ("the '907 patent"). The self-adjusting contact includes a plurality of conductive fibers, such as wires, that provide sufficient contact with a battery terminal for high current flow. However, the self-adjusting contact of the '907 patent does not provide a separate voltage probe. Consequently, there is a need for an improved battery testing machine or apparatus, a battery test contact assembly and/or a battery test contact that provides a current flow path and a separate voltage measurement, which is preferably particularly well-suited for high current flow.

SUMMARY OF THE INVENTION

In one embodiment, the present invention provides an electrical contact device, which includes a base, a crown spring received in the base, a rod or probe or plunger received in the crown spring and a coil spring around the rod and at least a portion of the base. The base has upper and lower ends, a bore extending between the upper and lower ends, an upper portion adjacent to the upper end, a lower portion adjacent to the lower end and an outer surface. The upper portion has a cylindrical shape that has an outside diameter that is smaller than the width or outside diameter of the lower portion, and an outside shoulder is defined on the outer surface between the upper and lower portions. The base has a lower inside shoulder that protrudes into the bore between the upper and lower ends and an upper inside shoulder near or adjacent to the upper end that protrudes into the bore. The lower inside shoulder is spaced apart from the upper inside shoulder. The crown spring is received in the bore of the upper portion of the base between the lower and upper inside shoulders. The crown spring defines a crown spring bore. The rod is elongated and has a bottom portion received in sliding engagement with the crown spring within the crown spring bore and a top portion that protrudes from the base. The top portion of the rod has a flange. The coil spring surrounds the rod and the upper portion of the base between the flange on the rod and the outside shoulder on the base. In one embodiment the rod is a current probe; the base, the crown spring and the rod are electrically conductive; and the rod, the crown spring and the base are in physical contact such that an electrical current can flow between the rod and the base through the crown spring, where the rod preferably has a longitudinal bore in which an electrically-insulated voltage probe is located. A contact sheet is preferably fixed to the top portion of the rod and preferably has a plurality of prongs that partially cover the end of the rod. The prongs preferably have a curved shape, preferably with several bends. In alternative embodiments of the electrical contact device, the arrangement of the coil spring can be altered along with some other modifications, where in one case the coil spring completely surrounds the base, and in another case the coil spring is inside the base. The rod can be modified in alternative embodiments to provide different surfaces upon which the coil spring can abut, such as a difference in diameter to provide a shoulder or by adding a radially-extending flange.

The electrical contact device, or one of its alternative embodiments, is mounted in a circuit board, which is used in a battery test clamp, in other embodiments of the present invention. The battery test clamp includes first and second printed circuit boards, a battery contact mounted in the first board and one or more electrically-conductive posts fixed to one of the boards and received in sliding engagement with the other board. One of the electrical contact devices is mounted in the second board opposite the battery contact mounted in the first board, which allows a battery to be held between the electrical contact device and the battery contact for testing the battery.

The present invention also provides a battery testing machine, system or apparatus. The system includes a cabinet in which a number of contact assemblies are received in openings in the cabinet. Battery trays that can hold a number of batteries are received in openings in the cabinet and are in electrical contact with terminals on the batteries for testing the batteries. A power supply is received in the cabinet for delivering a test current to the batteries. At least one power regulator for regulating current and a control module for receiving and issuing instructions for testing the batteries are preferably included. One or more of the electrical contact devices are used as battery contacts in the contact assemblies for connecting to and electrically engaging with the batteries in a battery test circuit for connecting to a battery for testing operating specifications for the batteries.

Another embodiment of the invention is a testing contact assembly, such as for testing batteries, that includes a support base, a tubular element fastened to the support base, a coil spring in the tubular element, a rod-shaped probe having a lower portion inside and engaged by the coil spring and a contact sheet that has a base portion and a plurality of prongs that extend from the base portion. The base portion of the contact sheet is fixed to and electrically connected with an upper portion of the current probe, and the prongs extend over and partially cover the upper end of the current probe. The prongs are preferably spaced apart from the upper end of the current probe and preferably have bends or curves, which may assist in a spring action to help provide resiliency for the prongs. The tubular element is a plastic bolt, which is fastened to the support base by a nut, in one embodiment. A voltage probe can be received in a longitudinal bore in the current probe for some applications. The testing contact assembly can be modified to make the tubular element electrically conductive, preferably adding a crown spring in the tubular element between the probe and the tubular element for improved electrical connectivity, and preferably using a printed circuit board as the support base. Other embodiments of the invention include any one or more of these testing contact assemblies in a battery testing machine or system or in a battery test clamp.

BRIEF DESCRIPTION OF THE DRAWINGS

A better understanding of the invention can be obtained when the detailed description of exemplary embodiments set forth below is considered in conjunction with the attached drawings in which.

DETAILED DESCRIPTION OF THE EXEMPLARY EMBODIMENTS

Figure 1:
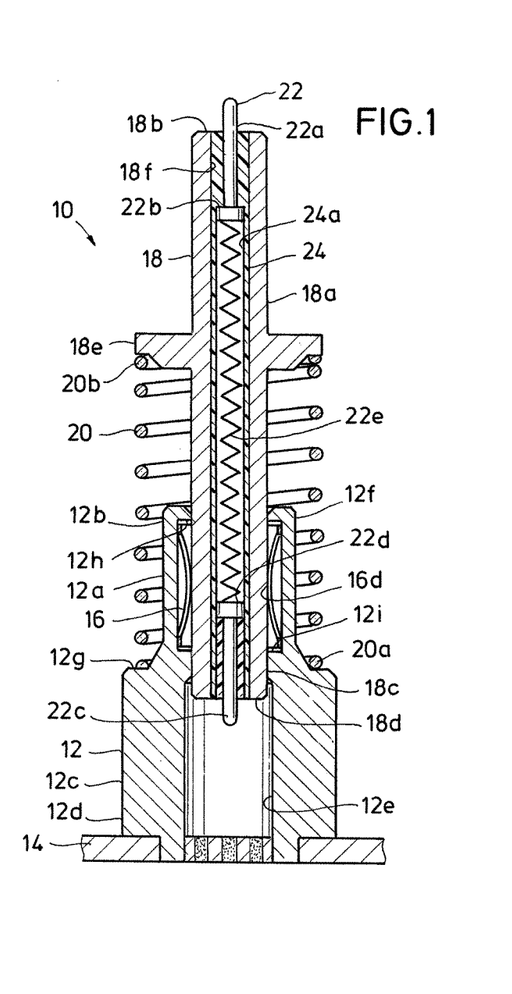
FIG. 1 is a partial cross-section of a side elevation of a battery test contact assembly in a relaxed state, according to the present invention.
Figure 2:
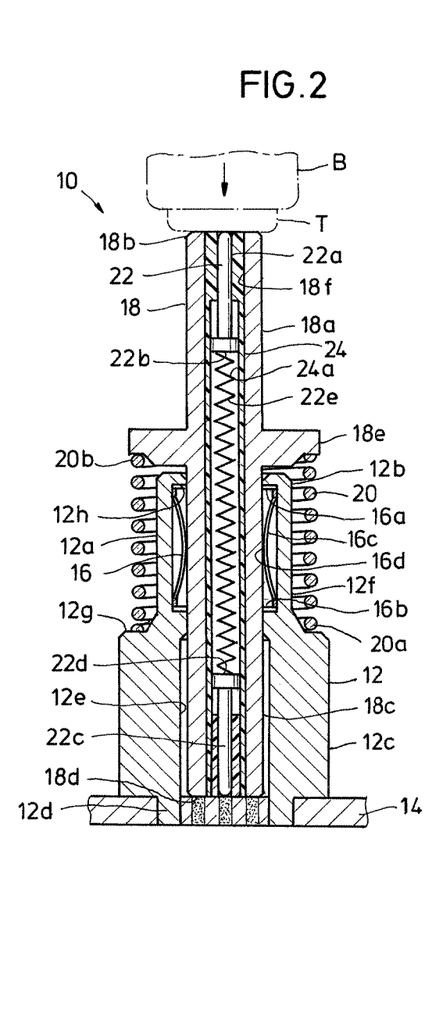
FIG. 2 is a partial cross-section of a side elevation of the battery test contact assembly of FIG. 1 in a compressed state, according to the present invention.

FIG. 1 is a cross-section of a side elevation view of a battery test contact assembly 10 in a relaxed state. FIG. 2 is a cross-section of a side elevation view of the battery test contact assembly 10 in a compressed state while testing a battery B that has a terminal T. A base 12 is fastened to and electrically connected to a printed circuit board 14. Base 12 has an upper portion 12a, an upper end 12b, a lower portion 12c and a lower end 12d. A bore 12e is coaxial with a longitudinal axis of base 12 and extends through the entire length of the base 12. The upper portion 12a of the base 12 has a cylindrical outer surface 12f, which has an outside diameter that is smaller than a width or outside diameter of the lower portion 12c, which may or may not be cylindrical. An outside shoulder 12g is defined at the outside interface of the two different diameters. The base 12 has a cap or an upper inside shoulder 12h at its upper end 12b and a lower inside shoulder 12i defined at the inside interface between the upper portion 12a and the lower portion 12c. The bore 12c has a first diameter at the lower end 12d of the base, a second smaller diameter at the inside interface adjacent to the lower inside shoulder 12i and a third greater diameter between the lower inside shoulder 12i and the upper inside shoulder 12h.

Figure 3:
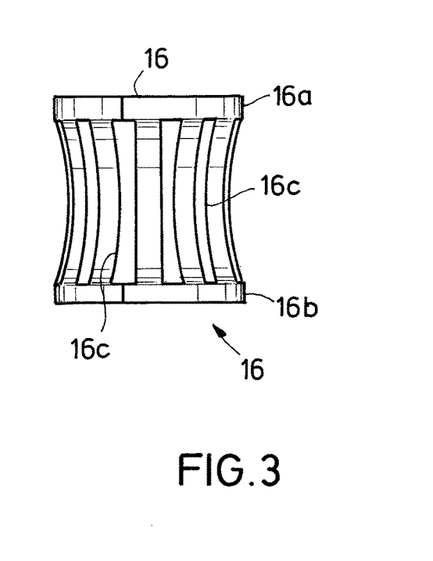
FIG. 3 is a side elevation of a crown spring used in the present invention.

FIG. 3 is a side elevation of a crown spring 16. Crown spring 16 has an upper split ring 16a and a lower split ring 16b. The splits in the rings allow one to coil the rings in upon themselves to reduce the diameter of the rings so that crown spring 16 can be inserted into the upper portion 12a of the base 12. After insertion, the coils spring outwardly to fit tightly within the inside diameter of the upper portion 12a between the upper inside shoulder 12h and the lower inside shoulder 12i of the base 12. A plurality of longitudinal spring elements 16c are formed integral with and extend between the upper split ring 16a and the lower split ring 16b of the crown spring 16. Each spring element 16c resembles a leaf spring, which has the shape of a flat, elongate, rectangular bar that is bent into a curved arc shape. The arc shape of each spring element 16c provides a smaller inside diameter for the crown spring 16 in the longitudinal middle of the crown spring compared to the inside diameter of the upper split ring 16a and the lower split ring 16b of the crown spring 16, thereby giving the crown spring 16 an overall waist shape. Crown spring 16 can be said to have a shape resembling that of a drum that has a central diameter that is smaller than the diameter of each of its equal-sized ends, which can be said to be a waist shape. The plurality of longitudinal spring elements 16c define an inside bore 16d that has a circular cross-section. Crown spring 16 is made of an electrically conductive spring metal, such as a copper alloy.

Returning to FIG. 1, an elongate rod 18, which is used as a current probe in a preferred application for testing batteries, has a top portion 18a, a top end 18b, a bottom portion 18c and a bottom end 18d. The words rod, probe and current probe may be used interchangeably in this description of the invention. The bottom portion 18c of the current probe 18 is received in the bore 12e of the base 12 and in a tight, sliding engagement with the plurality of longitudinal spring elements 16c in the bore 16d of the crown spring 16. The contact between the current probe 18 and the plurality of longitudinal spring elements 16c of crown spring 16 provides a good electrical connection between the current probe 18 and the crown spring 16 suitable for high-current battery testing. The upper and lower split rings 16a and 16b expand outwardly by spring action to provide good electrical contact between the crown spring 16 and the base 12, which is in good electrical contact with the printed circuit board 14 for high-current battery testing.

A coil spring 20 is placed around and over the outer surface 12f of the upper portion 12a of the base 12 before the rod 18 is inserted into the crown spring 16. A lower end 20a of the coil spring 20 rests on the outside shoulder 12g of the base 12. The rod or current probe 18 has a flange 18e that projects radially outwardly, preferably 360 degrees around the longitudinal axis of the rod 18. An upper end 20b of coil spring 20 rests against an underside of flange 8e. Coil spring 20 is placed on and around the upper portion 12a of the base 12 after the crown spring 16 is coiled and inserted into the bore 12e and before the bottom portion 18c is inserted into the inside bore 16d of the crown spring 16. Coil spring 20 is trapped between the topside of the outside shoulder 12g on the base 12 and the underside of the flange 18e on the rod 18. Coil spring 20 is compressed as the battery test contact assembly is pressed against battery terminal T, as shown in FIG. 2, which provides a spring force to assure good electrical contact with the battery terminal T suitable for high-current battery testing.

Current probe 18 has a central, longitudinal bore 18f that is coaxial with the longitudinal axis of the current probe 18 in the embodiment of the invention shown in FIGS. 1 and 2. A voltage probe 22 is received in the bore 18f of the current probe 18. It is optional to include the bore 18f and the voltage probe 22, but the voltage probe 22 is useful for testing batteries. However, a device that includes the base 12, the crown spring 16, the coil spring 20 and the probe 18 is useful, without the voltage probe 22 and without the PCB 14. The device could further include a nonconductive housing surrounding the base 12, probe 18 and spring 20 and a wire attached to the bottom end 18d, which would make the device useful as a probe for electrical testing.

FIGS. 1 and 2 show an electrically-insulating cylinder 24 that fits snugly inside the bore 18f of the current probe 18. Cylinder 24 does not move with respect to the current probe 18 after assembly. Cylinder 24 has a central, longitudinal bore 24a that is coaxial with the longitudinal axis of the hollow cylinder 24. The voltage probe 22 is received in the bore 24a of the insulating cylinder 24, and the cylinder 24 separates the voltage and current probes for separate and independent test measurements for the voltage of a battery and a current test of the battery. Voltage probe 22 is illustrated in FIGS. 1 and 2 as having an upper probe element 22a that has a head 22b that is slidingly engaged with the inside wall of the insulating cylinder 24 and a lower probe element 22c that has a head 22d that is slidingly engaged with the inside wall of the insulating cylinder 24. A voltage probe spring 22e presses outwardly against the heads 22b and 22d and provides electrical conduction between the upper probe element 22a and the lower probe element 22c. The upper probe element 22a and the lower probe element 22c extend outside of the current probe 18 in its relaxed state shown in FIG. 1, but are pushed in even with the outer tip surfaces of the current probe 18 in the compressed state shown in FIG. 2 during testing of a battery. The lower probe element 22c makes electrical contact with a conductive material that passes through PCB 14 to a circuit printed on PCB 14 that is part of a voltage test circuit. Another embodiment of a voltage probe, which can be used instead of voltage probe 22, is shown in a subsequent figure.

Figure 4:
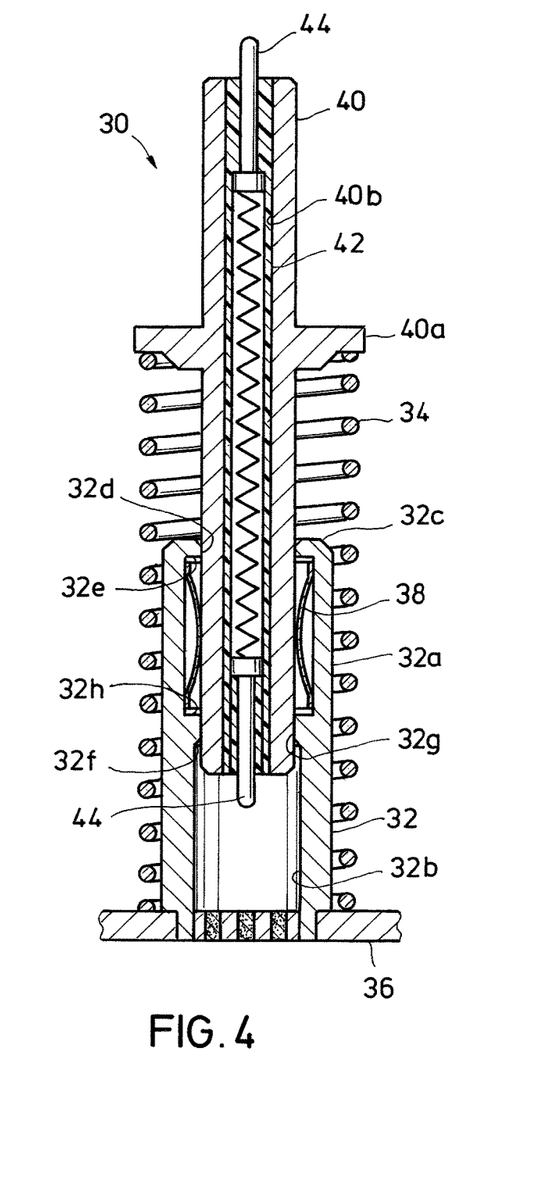
FIG. 4 is a partial cross-section of a side elevation of an alternative embodiment of a battery test contact assembly in a relaxed state, according to the present invention.

FIG. 4 is a cross-section of a side elevation view of a battery test contact assembly 30 in a relaxed state, which is an alternative embodiment of the battery test contact assembly 10 in FIGS. 1 and 2. Contact assembly 30 differs from contact assembly 10 in that a base 32 has a smooth, cylindrical outside wall 32a, which does not provide a shoulder for receiving a coil spring 34. Base 32 connects to a printed circuit board 36 and provides a portion of an electrical circuit. Base 32 has an inside bore 32b throughout its length, a cap 32c that provides an opening 32d and an upper inside shoulder 32e and an annular protrusion 32f that provides an opening 32g that is the same size as the opening 32d. The annular protrusion 32f provides a lower inside shoulder 32h. A crown spring 38 is received in the bore 32b between upper inside shoulder 32e and the lower inside shoulder 32h. A current probe 40 is received inside the coil spring 34, inside the base 32 and inside the crown spring 38. The current probe 40 has a radially-extending flange 40a, which gives the probe 40 an appearance similar to a bolt with a washer around its central portion, except without threads on the bolt. The coil spring 34 is trapped between the underside of the flange 40a and the upper side of the PCB 36 and surrounds all of the base 32 that is above the PCB 36. The current probe has a longitudinal bore 40b throughout its length, and an insulating, hollow cylinder 42 is received in the bore 40b. A voltage probe 44 is received inside the insulating cylinder 42. Voltage probe 44 is shown in FIG. 4 as having a construction like the voltage probe 22 in FIG. 1, but a different construction can be used, such as the one described in a subsequent drawing herein. Further, the voltage probe 44 is an optional feature that is useful in testing batteries. The voltage probe 44 and/or the PCB 36 can be omitted, and a housing can be added around the base 32, the probe 40 and the spring 34, thereby providing a probe for electrical testing, particularly with the addition of a suitable wire or cable for completing a circuit.

Turning now to FIGS. 5-9, FIG. 5 is a plan view of a contact sheet 50, which has a base portion 50a that has the appearance of a rectangular sheet that has an upper edge 50b, a lower edge 50c, a left edge 50d and a right edge 50e. A plurality of fingerlike projections 50f extend upwardly or outwardly from the upper edge 50b. The contact sheet 50 is stamped punched or cut out of a thin, flat sheet of electrically conductive material, such as copper or a copper alloy. A side view of the contact sheet would look like an edge view of a sheet of card stock or very thin cardboard. However, the fingerlike projections 50f are bent into a desired profile shape. FIGS. 6A and 6B are side views of contact sheet 50 before and after the fingerlike projections 50f are bent, respectively. Each of the fingerlike projections 50f has a first bend 50g that moves an outer tip 50h of a projection 50f toward the base portion 50a, a second bend 50i that moves its tip 50h away from the base portion 50a and a third bend 50j that moves its tip 50h toward the base portion 50a. Three gently arced bends are made to contact sheet 50 in this embodiment: the first bend 50g adjacent to and toward the base portion 50a, the second bend 50i in about the middle of the projection 50f that curves away from the base portion 50a and the third bend 50j near the end of the projection 50f toward the base portion 50a.

Figure 7:
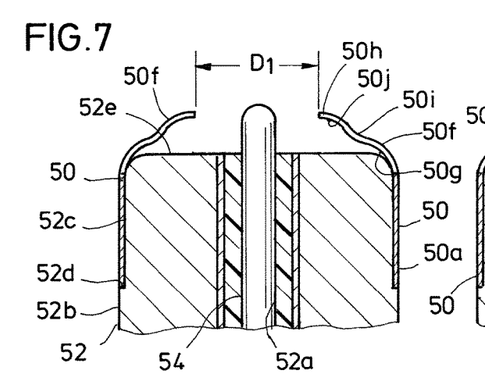
FIG. 7 is a partial cross-section of a side elevation of a current probe and a voltage probe fitted with the contact sheet of FIGS. 5 and 6B and in a relaxed state.

FIG. 7 is a cross-section of a side elevation of an upper end of a current probe 52, which has a bore 52a. A voltage probe 54 is received in the bore 52a. The current probe 52 has a lower portion 52b and an upper portion 52c. The lower portion 52b has a greater diameter than the upper portion 52c, which provides an upwardly facing shoulder 52d at the interface of the two different diameters. The base portion 50a of the contact sheet 50 is wrapped around and fixed to the smaller-diameter upper portion 52c of the current probe 52. Each of the fingerlike projections 50f of the contact sheet 50 rises slightly above an upper end 52e of the current probe 52 and generally bends inwardly toward the center of the upper end 52e of the current probe 52.

Figures 5, 6A, 6B:
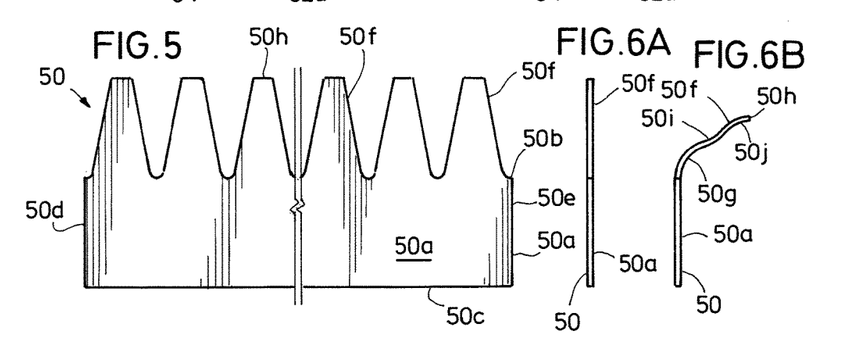
FIG. 5 is a plan view of a multi-point, multi-touch contact sheet, according to the present invention.
FIGS. 6A and 6B are side elevations of the contact sheet of FIG. 5 before and after a bending operation, respectively, according to the present invention.
Figure 8:
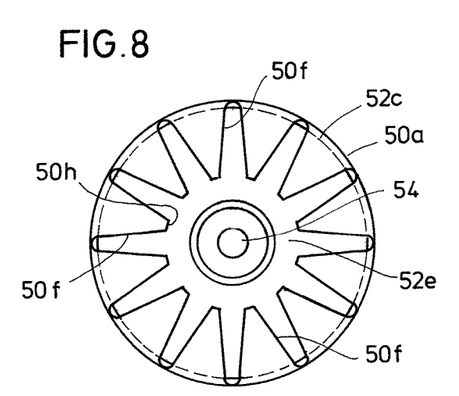
FIG. 8 is a top plan view of the current probe, voltage probe and contact sheet of FIG. 7.

FIG. 8 is a top plan view of the current probe 52 fitted with the contact sheet 50 in FIG. 7. Each of the fingerlike projections 50f of the contact sheet 50 is bent over the upper end 52e of the current probe 52. The fingerlike projections 50f of the contact sheet 50 partially cover the upper end 52e of the current probe 52. The tip 50h of each fingerlike projection 50f is spaced a sufficient distance from the voltage probe 54 to prevent electrical conduction between the current probe 52 and the voltage probe 54 through the contact sheet 50. A procedure for making a contact sheet has been described as: stamping out a rectangular sheet that has a base portion and prongs; bending the prongs into a desired shape; wrapping the sheet around an end portion of a probe; and soldering the base portion of the contact sheet to the probe with the prongs partially covering but spaced from the end of the probe. The bending operation to get a desired shape for the prongs, such as shown in FIG. 6B, can include rolling the sheet such that the base portion is given a cylindrical shape, which can be placed on a cylindrical end portion of a probe. This procedure results in a seam in the base portion of the contact sheet after soldering onto the probe. The contact sheet can alternatively be made by punching out a circular, disk-shaped sheet, while at the same time bending the prongs or fingerlike projections into a desired shape. The punching operation yields a cup-shaped or hat-shaped contact sheet. The cup-shaped or hat-shaped contact sheet can be slipped or placed onto an end portion of a cylindrical probe, which eliminates the need to wrap a flat sheet around a cylindrical end portion of the probe, which also eliminates a seam in the contact sheet.

Figure 9:
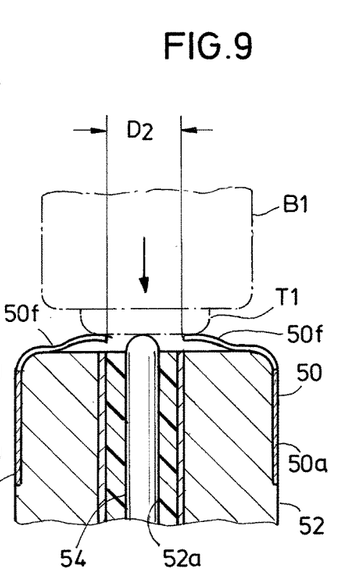
FIG. 9 is a partial cross-section of a side elevation of the current probe, voltage probe and contact sheet of FIG. 7 in a compressed state.

FIG. 9 is a side elevation of the device of FIG. 7 pressed into contact with a terminal T1 of a battery B1 for testing the battery or for electrical contact with the battery. The contact sheet 50 is made of an electrically conductive spring material. Each of the fingerlike projections 50f functions as a cantilever spring having one end fixed to the base portion 50 and leaving the tip 50h free. FIG. 7 shows a side view of a pair of the fingerlike projections 50f in a relaxed state. The tips 50h of the fingerlike projections 50f circumscribe a circle having a diameter, which is a diameter D1 in the relaxed state of FIG. 7, and a smaller diameter D2 in the compressed state of FIG. 9. As the fingerlike projections 50f are compressed, the tips 50h move toward the center of the current probe 52, thereby reducing the diameter of a circle circumscribed by the tips 50h in FIG. 9 compared to the relaxed state in FIG. 7.

Contact sheet 50 of FIG. 5 in combination with the current probe 52 in FIG. 9 provides a plurality of electrical contact points between the current probe 52 and the battery terminal T1 though the plurality of fingerlike projections 50f on the contact sheet 50, which is in electrical contact with the current probe 52. The plurality of electrical contact points between the current probe 52 and the battery terminal T1 helps to assure good electrical contact that is suitable for high-current battery testing, as well as other applications where dependable electrical contact between two surfaces is highly desirable. If the battery terminal T1 has surface imperfections, such as pits, bumps or unevenness, then at least some if not all of the fingerlike projections 50f will make good and adequate contact with the battery terminal T1 to allow a circuit through the battery terminal T1, the plurality of fingerlike projections 50f of the contact sheet 50, the base portion 50a of the contact sheet 50 and into the current probe 52, which is suitable for the flow of a high current through the circuit. Contact sheet 50 can be soldered to the current probe 52 to provide a multi-point, multi-contact probe or battery-testing stylus. Inclusion of the voltage probe 54 is optional and may not be needed for some applications where it is desirable to flow current between two devices, although it is useful to include the voltage probe with the current probe in testing batteries. If the voltage probe is included, the fingerlike projections should not be long enough to make contact with the voltage probe while the battery contact assembly is pressed against the battery terminal. It is preferable to keep the current probe and its circuit separate from the voltage probe and its circuit. The fingerlike projections circumscribe a circle having a diameter D1. The fingerlike projections move inwardly as the battery contact assembly is pressed against a battery terminal, which reduces the size of the circle circumscribed by the fingerlike projections to a diameter D2. Diameter D1 is greater than diameter D2.

Alternative embodiments of a contact sheet are contemplated, particularly with respect to a bending pattern for the fingerlike projections. A contact sheet typically has a rectangular base portion and a plurality of prongs, tines or fingerlike projections that project outwardly from the base portion. Notches may be cut into each side of each prong to reduce the width of the prong. If the width of the prong is too great, the prong will tend to wrinkle where it is bent over the circular head of a current probe. A contact sheet may begin as a thin sheet of electrically-conductive material, which is stamped or punched to cut out a shape for a desired embodiment. An example of a side profile of a contact sheet after the prongs are bent includes a curved shape that first bends about 45 degrees, preferably between 30 and 60 degrees, toward a central current probe, then curves away from and parallel to the current probe, then continues to curve in a circular arc such that one tangent line is perpendicular to the base portion and another tangent line near the end of the fingerlike projections is parallel to the base portion of the contact sheet. The side profile of the contact sheet, after this bending operation, can be said to have a shape that resembles a question mark. The shape of the side profile of contact sheet can also be said to resemble the profile of an open eye hook screw, without threads on the screw portion.

Alternatively, the other side of this contact sheet can be placed in contact with the current probe, in which case the open portion of the hook shape of the prongs would face inwardly. In this alternative embodiment, which is not shown in the drawings, but which can be understood without the need for a drawing, the bend adjacent to the base portion of the contact sheet may be lessened, such as to about 30 degrees, and the curved hook end portion of the projections could be coiled more so that the projections tend to coil upon themselves when pressed against a battery terminal and uncoil when pulled away from the battery terminal.

Figure 10:
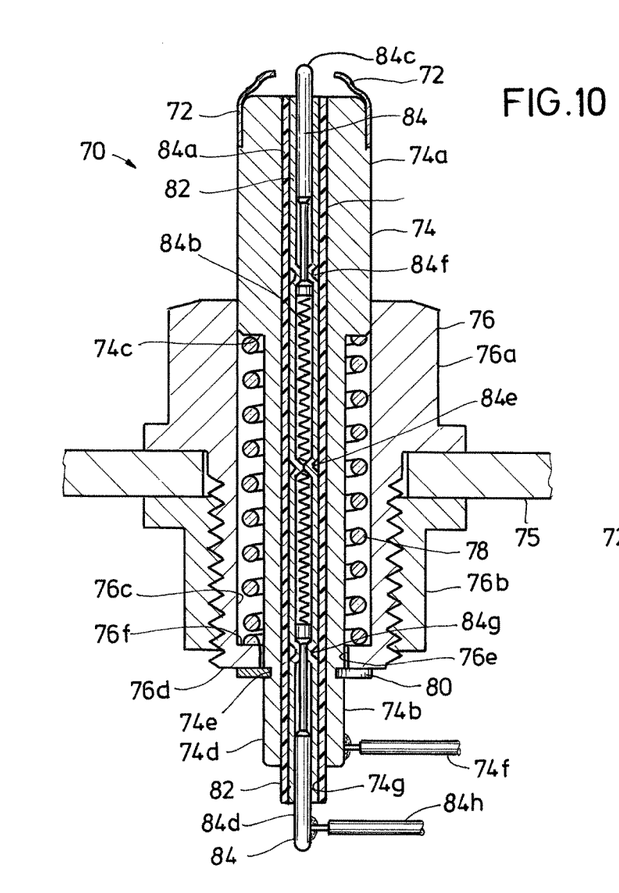
FIG. 10 is a partial cross-section of a side elevation of a battery testing contact assembly, according to the present invention.
Figure 11:
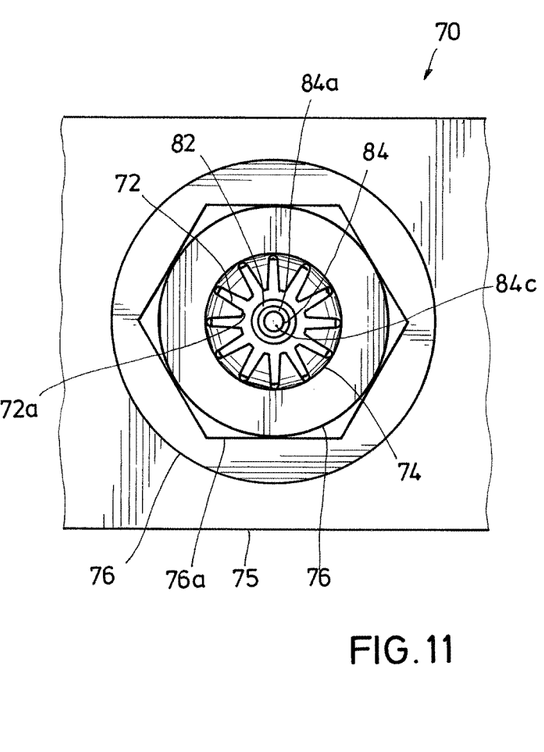
FIG. 11 is a top plan view of the battery testing contact assembly of FIG. 10.

FIG. 10 a cross-section of a side elevation of a battery testing contact assembly 70 that is fitted with a contact sheet 72. FIG. 11 is a top plan view of the battery testing contact assembly 70. A current probe 74 is mounted in a printed circuit board (PCB) 75. Current probe 74 has an upper cylindrical head portion 74a and a lower cylindrical body portion 74b. The contact sheet 72 is wrapped around or slipped over a recessed portion of the head portion 74a at its upper end and soldered into a fixed position. Contact sheet 72 has the construction described for contact sheet 50 in FIGS. 5-9. The diameter of the head portion 74a of the current probe 74 is greater than the diameter of the body portion 74b, thereby defining a shoulder 74e at the interface between the two portions. The current probe 74 is received in a plastic or otherwise electrically nonconductive bolt and nut assembly 76 that includes a bolt 76a and a nut 76b. Bolt 76b has a longitudinal bore 76c throughout its length, except at a bottom end 76d, which has an opening 76e. The opening 76e is smaller in diameter than the diameter of the bore 76d, and a shoulder 76f is defined at the interface between bore 76d and opening 76e. A coil spring 78 is inside the bore 76c of the bolt 76a. The body portion 74b of the current probe 74 is placed inside the spring 78, which is inside the bore 76c of the bolt 76a. A lower end 74d of the current probe 74 protrudes from the bolt 76a. The current probe 76 has a groove 74e notched into the body portion 74b near the lower end 74d. A C-shaped snap ring 80 fits into the groove 74e in the current probe 74. The spring 78 is trapped between the shoulder 74c on the current probe 74 and the shoulder 76f in the bolt 76a. Spring force tends to push the head portion 74a of the current probe 74 out of the bolt 76a, while the snap ring 80 limits the outward movement of the head portion 74a. Spring 78 provides a spring force while the contact sheet 72 of the battery testing contact assembly 70 is pressed against a battery terminal. The assembly of the current probe 74, the spring 78 and the bolt 76a is placed through a hole in the printed circuit board 75, and nut 76b is threaded onto bolt 76a to fasten the assembly to PCB 75. A wire 74f is soldered to the current probe for completing a circuit for current load testing of a battery.

Current probe 74 optionally, but preferably, includes a central longitudinal bore 74g. An electrically nonconductive, hollow cylinder 82, which may be made of a plastic or a ceramic material, is received in a snug fit inside the bore 74g, preferably throughout the length of the current probe 74 and extending outside the lower end 74d of the current probe 74. An electrically conductive voltage probe 84 is received inside the hollow, insulative cylinder 82. Voltage probe 84 comprises a tube 84a, a central coil spring 84b, which may be one or two coil springs, an upper probe element 84c and a lower probe element 84d. The tube 84a has a centrally located crimp 84e, an upper crimp 84f at about one fourth of its length from one end and a lower crimp 84g at about one fourth of its length from its other end. Each of the probe elements 84c and 84d have a head and an outer body portion that have an equal diameter that is nearly as great as the inside diameter of the tube 84. Each of the probe elements 84c and 84d also have an inner body portion between its head and its outer body portion, which has a smaller diameter than the diameter of the head and outer body portion. Voltage probe 84 can be assembled by first making the central crimp 84e in the tube 84a, placing springs 84b into each end of tube 84a, placing the head of each of the probe elements 84c and 84d into the tube 84a and making crimps 84f and 84g around the circumference of the tube 84 in a location and to an extent that allows the probe elements 84c and 84d to travel the length of the lesser diameter inner body portion between its head and its outer body portion, while being trapped due to the crimp in the tube 84a around each inner body portion. Springs 84b lend to push the probe elements 84c and 84d out of the tube 84a, while the crimps 84f and 84g prevent the heads of the probe elements from moving beyond the crimps 84f and 84g. A wire 84h is attached to the lower probe element 84d of the voltage probe 84 for completing a circuit for testing the voltage of a battery.

The battery testing contact assembly 70 can be placed in a battery test contact assembly such as described in U.S. Pat. No. 5,903,154 or in a battery tray that becomes part of a large battery testing machine such as described in U.S. Pat. No. 5,966,014. The contact assembly 70 is assembled in a device that can hold a battery that has two terminals, where the multi-point, multi-touch contact sheet 72 of the current probe 74 and the voltage probe 84 are pressed into a tight, firm engagement with one battery terminal, while a different or another contact assembly is pressed into engagement with the other battery terminal. A battery testing procedure, such as described in the '014 patent, is executed, which can determine whether the battery satisfies quality-control specifications. The multi-point, multi-touch contact sheet 72 is part of the current probe 74 because it is fixed to, such as by soldering, and electrically conductive with the current probe 74. The multi-point, multi-touch contact sheet 72 has a plurality (12 in FIG. 11) of fingerlike projections 72a, which provides a plurality of physical contact points or locations for electrical conduction between the current probe 74 and the terminal of a battery undergoing testing. Any irregularities in the surface of the battery terminal, such as pits, bumps, hills, valleys and slopes, are accommodated to a great extent because there are many possible points of contact since there are many fingerlike projections, as described for the contact sheet 50 in FIGS. 5-9, and because each fingerlike projection is a spring that presses into contact with whatever surface is presented by the battery terminal. Various designs and bends can be made in the fingerlike projections to provide suitable electrical contact for high-current battery testing, such as described in the '014 patent.

Another design for an electrical contact device comprises a barrel, a crown spring received in the barrel, a plunger received inside the crown spring and a coil spring received inside the barrel that tends to push the plunger out of the barrel. The barrel can be mounted in a portable, electrically-nonconductive housing to function as an electrical probe for testing electrical components, in which case a wire would be in electrical contact with the plunger for completing a circuit. The barrel can be mounted to a printed circuit board (PCB), which serves as a solid, fixed base that can oppose the spring force of the coil spring. In this embodiment of the invention, the barrel is electrically conductive, and a lower end is electrically and physically attached to an upper side of the PCB with electrical conductivity to a circuit printed on an underside of the PCB. The barrel has an upper end, which has a cap. The barrel is a hollow, cylindrical tube that has an inside diameter. The cap has a central opening that has a diameter smaller than the inside diameter of the barrel. While the cap could provide an inside shoulder, in one design the probe assembly has an upper retaining ring adjacent to the inside surface of the cap and a lower retaining ring spaced a distance lower to accommodate the crown spring between the upper and lower retaining rings. The crown spring has a construction similar to that of the crown spring described with reference to FIG. 3. The plunger has a radially-extending flange near a bottom end, which opposes an upper end. The coil spring is trapped between an underside of the flange and the upper side of the PCB.

The electrical contact device can be assembled by inserting the upper retaining ring into the barrel through the lower end, then the crown spring and then the lower retaining ring. As an alternative to the retaining rings, the barrel can have a larger inside bore near its upper end, as was described with reference to FIG. 1, to provide a recess for receiving the crown spring in a fixed location. The upper end of the plunger is inserted into the lower end of the barrel and passed through the inside bore of the crown spring and out of the upper end of the barrel. The coil spring is inserted into the lower end of the barrel, around the bottom end of the plunger and against an underside of the flange. The barrel can then be inserted into and fixed to the PCB. The crown spring provides good electrical contact between the plunger and the barrel, making the device particularly good for high-current testing, more particularly for testing batteries.

A hand-held probe can be made by placing the barrel in a plastic or ceramic housing and attaching or soldering a wire to the barrel. The plunger may have a central longitudinal bore and a voltage probe received in the bore, such as was described with reference to FIG. 10. The electrical contact device may further include a current-probe head. The current-probe head is preferably a solid cylinder of electrically-conductive material, such as copper or a copper alloy, which surrounds and is attached to the upper end of the plunger, such as by soldering, to provide good electrical connectivity between the head and the plunger, preferably suitable for high current flow. A multi-point, multi-touch contact sheet is preferably attached to the current-probe head. Various embodiments of a contact sheet are suitable, depending on the end-use application. A suitable contact sheet can be stamped, punched or cut from a thin sheet of electrically-conductive material, which is typically a metal, typically copper, a copper alloy, silver, gold or another material used in the electronics industry. The contact sheet may have a base portion, which has the appearance of a rectangular sheet, sized to wrap around a probe. The contact sheet may further include a plurality of projections integral with the base portion that project outwardly, typically from a long side of the rectangular base portion. The contact sheet should have flexibility and resilience that imparts characteristics of a spring, particularly for the fingerlike projections. The fingerlike projections can be bent into a shape that further imparts flexibility and resilience so the projections have spring-like functionality.

This embodiment can be described as an electrical probe device that includes: a barrel; an elongate plunger having a tip on a distal end and a tail on an opposing proximal end, where the plunger tail is slideably engaged inside the barrel, where the plunger tip protrudes from the barrel; a spring trapped in the barrel that provides a force for pushing the plunger tip away from the barrel; and a contact sheet wrapped circumferentially around or slipped over and fixed to the plunger tip, where a contact portion of the contact sheet extends beyond the plunger tip and away from the barrel, and where the contact portion is bent over and partially covers the distal end of the plunger tip for providing an electrical contact surface, preferably where the contact portion of the contact sheet comprises fingerlike projections that are bent over and partially cover the distal end of plunger tip. The fingerlike projections preferably have: a first bend toward the distal end of the plunger tip that is located adjacent to where the contact sheet is fixed to the plunger tip; a second bend toward the distal end of the plunger tip that is spaced away from the first bend; and a third bend away from the distal end of the plunger tip that is located between the first and second bends, where the fingerlike projections are preferably flexible and resilient. The spring in the electrical probe device that provides a force for pushing the plunger tip away from the barrel is preferably a coil spring, and preferably, a crown spring surrounds the plunger inside the barrel. A battery testing stylus can include a base and the electrical probe device connected directly or indirectly to the base. A battery test clamp for holding a battery to be tested and for engaging a pair of battery terminals on the battery can include an upper test board; a lower test board; a set of posts extending between the upper and lower test boards to space the boards apart so that a battery can be releasably positioned between the boards for testing; first and second board mounted battery test contacts for operatively engaging the pair of battery terminals; and a set of board mounted post grips aligned with and gripping the set of posts so that the battery test clamp is a rigid structure sized to accommodate a selected battery size positioned between the boards, where the boards are selectively and controllably movable to adjust to different battery sizes on relative movement of the boards with respect to the set of posts, where the battery test contacts are resiliently urged to engage the battery terminals with contact pressure, and where at least one of the first or second board mounted battery test contacts comprises the electrical probe device, preferably where the plunger in the electrical probe device has a bore that is coaxial with its longitudinal axis throughout its length and a voltage probe slideably received in the bore of the plunger. The electrical probe device preferably further includes a crown spring received in the barrel, where the plunger is received in the crown spring.

Another embodiment of the electrical probe device can be described as including: a barrel having a longitudinal bore; a crown spring received in the bore; an elongate plunger having a distal end portion and an opposing proximal end portion, where the proximal end portion is received in and is slideably engaged with the crown spring, where the distal end portion protrudes from the barrel; and a coil spring trapped in the barrel that tends to push the distal end portion of the plunger out of the barrel. The electrical probe device can further include a head attached to the distal end portion of the plunger and a contact sheet wrapped circumferentially around or slipped on and fixed to the head, where the distal end portion of the plunger terminates in a distal end, preferably where the contact sheet has a plurality of fingerlike projections that are bent over and partially cover the distal end of the plunger for providing an electrical contact surface.

In the embodiments of the invention that include a crown spring and a coil spring, the spring forces of these two elements are preferably balanced so that the crown spring keeps a probe or plunger engaged in a base or barrel, without any further retaining element being required for the engagement, while the coil spring tends to push the probe or plunger out of the base or barrel. The crown spring fits tightly enough around the probe, rod or plunger to hold the probe, rod or plunger inside the base or barrel while turned upside down, thereby preventing gravity from disengaging the probe, rod or plunger from the base or barrel. Spring forces should also be balanced between a current probe and a voltage probe to assure proper operation. Spring forces, lateral spacing and longitudinal positioning should also be taken into consideration with respect to the fingerlike projections of a contact sheet and a voltage probe.

Embodiments of the Invention

An embodiment of the present invention is a combination of an electrically-conductive crown spring inside and in physical contact with a tubular base, a rod, plunger or probe received inside and in physical contact with the crown spring and another type of spring, such as a coil spring or a gas spring, for pushing or pulling the rod, plunger or probe in the crown spring. Another embodiment of the invention is a contact sheet having a plurality of prongs or fingerlike projections extending co-planar from a base portion, where the base portion is fixed to some type of electrical probe or contact, such as by soldering, and where the prongs extend the length of and partially cover an end of the electrical probe or contact, after the prongs or fingerlike projections have been bent and are no longer co-planar with the base portion.

Embodiment 1 is an electrical contact device that includes a base, a crown spring, a rod, such as a probe or plunger, and a coil spring. The base has upper and lower ends, a bore extending between the upper and lower ends, an upper portion adjacent to the upper end, a lower portion adjacent to the lower end and an outer surface, wherein the upper portion has a cylindrical shape that has an outside diameter that is smaller than the width or outside diameter of the lower portion such that an outside shoulder is defined on the outer surface between the upper and lower portions, wherein a lower inside shoulder is provided that protrudes into the bore between the upper and lower ends, wherein an upper inside shoulder is provided near or adjacent to the upper end that protrudes into the bore, wherein the lower inside shoulder is spaced apart from the upper inside shoulder. The crown spring is received in the bore of the upper portion between the lower and upper inside shoulders, wherein the crown spring defines a crown spring bore. The rod has a bottom portion received in sliding engagement with the crown spring within the crown spring bore and a top portion protruding from the base. The top portion of the rod has a flange, preferably like a radially-extending pipe flange. The coil spring surrounds the rod and the upper portion of the base and is located between the flange on the rod and the outside shoulder on the base. The rod can be pushed into engagement with an item being tested, such as a battery, and the coil spring applies a spring force for good contact with the test item. The crown spring provides good electrical contact between the rod and the base for forming a circuit suitable for high-current load on the test item. The coil spring also provides a parallel portion of the circuit, and some physical contact between the rod and the base may also contribute to the circuit. A voltage probe and/or a contact sheet can also be included. Embodiment 1 is believed to read on FIGS. 1 and 2 in the present specification.

Embodiment 2 is an electrical contact device that includes a support base, a tube connected to the support base such that the tube is perpendicular to the support base, a crown spring inside the tube, a rod probe or plunger received in the tube and a coil spring surrounding the tube between the support base and a flange on the rod. The coil spring tends to push the rod out of the support base. The rod is engaged with the crown spring in a friction fit that holds the rod within the crown spring and within the tube while also allowing the rod to slide within the crown spring. The support base is preferably a printed circuit board. The tube is in electrical contact with the printed circuit board, and the crown spring provides electrical connectivity between the rod and the tube. The tube preferably has a longitudinal bore and a pair of spaced apart shoulders that protrude into the bore. The crown spring is located between the pair of spaced apart shoulders. The rod preferably has a bore and a voltage probe received in its bore. Embodiment 2 is useful for testing batteries and is believed to read on FIG. 4 of this specification.

Embodiment 3 is an electrical contact device that includes a base, a tube, a crown spring inside the tube, a rod received inside the crown spring and a coil spring surrounding the tube, which is located between the base and a shoulder on the rod. The tube has opposing upper and lower ends, and the lower end is connected to the base, which is preferably a printed circuit board. The rod has opposing proximal and distal portions and ends, and it is the proximal portion of the rod that is received inside the crown spring. The rod is engaged with the crown spring in a friction fit that holds the rod within the crown spring, which is inside the tube, but the rod can slide back and forth in the crown spring when the friction fit is balanced with the spring force of the coil spring and a working force used during use of the electrical contact device. The rod has a first diameter toward the proximal end and a second diameter toward the distal end that is greater than the first diameter. The shoulder is defined at the interface between the first and second diameters. The coil spring tends to push the distal end of the rod away from the base.

Embodiment 4 is a battery testing contact assembly that includes a support base that has an opening, a tubular element, such as a bolt, received in the opening and attached to the support base, a coil spring received in the tubular element, a current probe that has a lower end received in the coil spring and a contact sheet fixed to the current probe that has a plurality of prongs or fingerlike projections that extend over and partially cover the upper end of the current probe. The contact sheet has a base portion, which is preferably rectangular, which can be wrapped around the circumference of and preferably soldered to the current probe adjacent to its upper end. The prongs are preferably integral and coplanar with the base portion before a bending operation. The contact sheet is preferably flexible and resilient and the prongs are bent into a shape having one or more curves for providing spring-like characteristics. The contact sheet can alternatively be made by punching out a flat, circular shape with the prongs pointing inwardly to have the appearance in FIG. 8, while nearly simultaneously bending the prongs into a desired shape, such as described with reference to FIG. 6B, thereby providing a hat-shaped contact sheet that can be placed on and soldered to the current probe. The plurality of prongs provide multiple points of contact with a test item, such as a battery terminal, which may have surface imperfections. The multiple points of contact help to make the battery testing contact assembly suitable for high-current applications, one of which is battery testing. Preferably, the current probe has a longitudinal bore, and a voltage probe is received in the bore. Embodiment 4 is believed to read on FIG. 10.

Embodiment 5 is an alteration of embodiment 4 to include a crown spring in the tubular element for providing multiple points of tight, firm, but sliding or slideable engagement between the plurality of leaf springs in the crown spring and the current probe. The crown spring and the tubular element should be designed and sized to assure good electrical conductance between the crown spring and the tubular element. The crown spring is believed to make the battery testing contact assembly of embodiment 5 even more suitable for high-current applications. The combined use of a contact sheet with its plurality of prongs for providing multiple points of contact between a current probe and a test item (battery) and the use of a crown spring with its plurality of leaf springs that surround and touch the current probe, while still allowing the current probe to be returned to its relaxed state by a coil spring, provides a high-current electrical testing apparatus.

Embodiment 6 of the invention is a battery testing machine or system that uses any one of the devices of embodiments 1 to 5. A prior art battery testing machine or system can be purchased from Arbin Instruments of College Station, Tex., USA; Maccor Inc. of Tulsa, Okla., USA;

Digatron Power Electronics of Aachen, Germany; Bio-Logic Science Instruments of Claix, France; and many other companies. The present inventor is associated with Arbin Instruments and is also a named inventor on U.S. Pat. Nos. 5,966,014; 5,903,154; and 7,614,907, which are described in the present specification. The '014 patent describes a battery testing machine or system in great detail, and the '154 patent describes a battery test contact assembly.

A battery testing machine or system according to the present invention typically includes an electrical cabinet for receiving electronic instrumentation as modules that are placed in the cabinet. The modules include a power supply that is capable of delivering a test current to a plurality of batteries simultaneously for testing the batteries, a control module, which is interfaced with a computer system that has a software program that a user can use for setting up a testing procedure for batteries, a number of battery trays that each hold a plurality of batteries; a current and voltage channel for delivering a current load to or measuring a voltage of the batteries; a communications bus for signals to pass between the modules; a charge/discharge bus for testing the batteries; auxiliary channels such as for measuring temperature; and preferably including a temperature control system for keeping the modules in the cabinet from overheating. The hardware in the cabinet includes printed circuit boards, current charge and discharge circuits, voltage circuits, a power supply, which may be a transformer or a switching power supply. The battery testing machine can be described as potentiostatic-galvanostatic testing equipment, meaning the control of voltage and current for charge and discharge of a device such as a battery or a capacitor. Most testing systems have multiple channels. Each channel allows the testing of one device. Cabinet or chassis size depends on the number of channels and the specifications of the channels. A single testing system may range from one high-powered channel to over one hundred low-powered channels. Several different methods are available for connecting to a battery or to a device for testing. Some battery holders can plug directly into the front of a testing system into one of the modules, which are generally only for single cells below 5 A. A significant part of the testing system is the user interface and control software that a user interacts with to set up a testing protocol and that controls the testing sequence and records the results. Embodiment 6 of the invention is thus described as this battery testing system, where one of the electrical contact devices shown in the drawings or described in this specification or described in the embodiments 1 to 5 above or recited in the appended claims is used as part of the battery testing system.

Embodiment 7 is a battery test clamp for holding a battery to be tested and for engaging a pair of battery terminals on the battery, which uses one of the electrical contact devices described in this specification. The battery test clamp includes upper and lower test boards, a set of posts extending between the upper and lower test boards to space the boards apart so that a battery can be releasably positioned between the boards for testing, and first and second board mounted battery test electrical contacts for operatively engaging the pair of battery terminals. A set of board mounted post grips are aligned with and grip the set of posts so that the battery test clamp is a rigid structure, which is sized to accommodate a particular battery size that is positioned between the boards. The boards are selectively and controllably movable to adjust to different battery sizes on relative movement of the boards with respect to the set of posts. A spring system can be used to push or pull the battery test contacts into engagement with the battery terminals.

Embodiment 7 of the present invention is thus described as this battery test clamp, where one of the electrical contact devices shown in the drawings or described in this specification or described in the embodiments 1 to 5 above or recited in the appended claims is used as part of the battery test clamp.

It is intended that various modifications to the embodiments of the invention described herein that are apparent to those skilled in the art be included within the scope of the appended claims.

What is claimed is:

1. An electrical contact device, comprising:
a base having upper and lower ends, a bore extending between the upper and lower ends, an upper portion adjacent to the upper end, a lower portion adjacent to the lower end and an outer surface, wherein the upper portion has a cylindrical shape that has an outside diameter that is smaller than the width or outside diameter of the lower portion such that an outside shoulder is defined on the outer surface between the upper and lower portions, wherein a lower inside shoulder is provided that protrudes into the bore between the upper and lower ends, wherein an upper inside shoulder is provided near or adjacent to the upper end that protrudes into the bore, wherein the lower inside shoulder is spaced apart from the upper inside shoulder;
a crown spring received in the bore of the upper portion between the lower and upper inside shoulders, wherein the crown spring defines a crown spring bore;
an elongate rod having a bottom portion received in sliding engagement with the crown spring within the crown spring bore and a top portion protruding from the base, wherein the top portion of the rod has a flange; and
a coil spring surrounding the rod and the upper portion of the base between the flange on the rod and the outside shoulder on the base.

2. The electrical contact device of claim 1, wherein the base, the crown spring and the rod are electrically conductive, wherein the rod is in physical contact with the crown spring, and wherein the crown spring is in physical contact with the base so that an electrical current can flow between the rod and the base through the crown spring.

3. The electrical contact device of claim 2, wherein the coil spring is electrically conductive, and wherein the coil spring provides an electrical current flow path between the rod and the base.

4. The electrical contact device of claim 1, wherein the rod has a rod bore coaxial with its longitudinal axis, and wherein the rod is a current probe, further comprising a hollow insulating cylinder received in the rod bore and a voltage probe received in the insulating cylinder.

5. The electrical contact device of claim 1, wherein the crown spring has a hollow cylindrical shape, a top end, a bottom end and a waist portion between the top and bottom ends, and wherein the inside diameter of the waist portion is smaller than the inside diameter of the top and bottom ends.

6. The electrical contact device of claim 1, wherein the rod has a length and opposing ends and a longitudinal rod bore extending the length between the opposing ends, further comprising an elongate probe received in the longitudinal rod bore of the rod.

7. The electrical contact device of claim 1, wherein the rod has an outer end adjacent to the top portion, further comprising a contact sheet fixed to the top portion of the rod, wherein the contact sheet at least partially covers the outer end of the rod.

8. The electrical contact device of claim 7, wherein the contact sheet has a plurality of prongs, and wherein the plurality of prongs partially cover the outer end of the rod.

9. The electrical contact device of claim 8, wherein the prongs have sufficient resiliency to have an initial spring force.

10. The electrical contact device of claim 9, wherein the prongs have an end portion that is spaced apart from the outer end of the rod.

11. The electrical contact device of claim 10, wherein the end portion of the prongs have a curved shape.

12. The electrical contact device of claim 8, wherein the top portion of the rod has an outer surface that defines a cylindrical shape, wherein the contact sheet surrounds the outer surface of the rod adjacent to the outer end of the rod, wherein each prong has a first curved portion located adjacent to the cylindrically-shaped outer surface of the top portion of the rod that curves inwardly toward the outer end of the rod, wherein each prong has an outermost tip, wherein each prong has a second curved portion located adjacent to the outermost tip that curves inwardly toward the outer end of the rod, and wherein each prong has a third curved portion located between the first and second curved portions that curves outwardly away from the outer end of the rod.

13. The electrical contact device of claim 12, wherein the prongs have sufficient resiliency to have an initial spring force.

14. The electrical contact device of claim 8, wherein the top portion of the rod has an outer surface that defines a cylindrical shape, wherein the outside diameter of the cylindrical shape of the rod adjacent to the outer end is reduced relative to the outside diameter some distance from the outer end for providing a recessed portion, and wherein the contact sheet is fixed to the recessed portion.

15. A battery test clamp, comprising:
a first printed circuit board;
a battery contact mounted in the first printed circuit board;
a second printed circuit board;
at least one electrically-conductive post fixed to one of the printed circuit boards and received in sliding engagement with the other printed circuit board; and
the electrical contact device of claim 1 mounted in the second printed circuit board opposite the battery contact mounted in the first printed circuit board so that a battery can be held between the electrical contact device and the battery contact for testing the battery.

16. A battery test clamp for holding a battery to be tested and for engaging a pair of battery terminals on the battery, comprising:
an upper test board;
a lower test board;
a set of posts extending between the upper and lower test boards to space the boards apart so that a battery can be releasably positioned between the boards for testing;
first and second board mounted battery test contacts for operatively engaging the pair of battery terminals; and
a set of board mounted post grips aligned with and gripping the set of posts so that the battery test clamp is a rigid structure sized to accommodate a selected battery size positioned between the boards, wherein the boards are selectively and controllably movable to adjust to different battery sizes on relative movement of the boards with respect to the set of posts, wherein the battery test contacts are resiliently urged to engage the battery terminals with contact pressure, and wherein
at least one of the first or second board mounted battery test contacts is the electrical contact device of claim 1.

17. A battery testing machine, comprising:
a cabinet having a plurality of openings;
a plurality of contact assemblies, wherein a contact assembly is received in each of the plurality of openings;
a plurality of battery trays removable received in the plurality of openings, wherein each battery tray can hold a plurality of batteries, and wherein each contact assembly is capable of establishing electrical contact with terminals on the batteries for testing the batteries;
a power supply received in the cabinet that is capable of delivering a test current to a plurality of batteries simultaneously for testing the batteries;
a control module capable of receiving and issuing instructions for testing the batteries;
one or more power regulators for regulating current used for testing the batteries;
a battery test circuit within each contact assembly for connecting to a battery for testing operating specifications for the batteries; and
a set of battery contacts in the contact assemblies for connecting to and electrically engaging with the batteries,
wherein at least a portion of the battery contacts in the contact assemblies comprise the electrical contact device of claim 1.

18. An electrical contact device, comprising:
a support base;
a tube having opposing upper and lower ends, wherein the lower end is connected to the support base;
a crown spring inside the tube;
a rod having opposing proximal and distal portions and ends, wherein the proximal portion of the rod is received inside the crown spring, wherein the rod is engaged with the crown spring in a friction fit that holds the rod within the crown spring and within the tube while also allowing the rod to slide within the crown spring, wherein the rod has a radially-extending flange between the proximal and distal portions; and
a coil spring surrounding the tube and trapped between the support base and the flange on the rod, wherein the coil spring tends to push the distal end of the rod away from the support base.

19. The electrical contact device of claim 18, wherein the support base is a printed circuit board, wherein the tube is in electrical contact with the printed circuit board, and wherein the crown spring provides electrical connectivity between the rod and the tube.

20. The electrical contact device of claim 19, wherein the tube has longitudinal bore and a pair of spaced apart shoulders that protrude into the bore, and wherein the crown spring is located between the pair of spaced apart shoulders.

21. The electrical contact device of claim 20, wherein the rod has a longitudinal rod bore, further comprising a voltage probe received in the rod bore.

22. An electrical contact device, comprising:
a base;
a tube having opposing upper and lower ends, wherein the lower end is connected to the base;
a crown spring inside the tube;
a rod having opposing proximal and distal portions and ends, wherein the proximal portion of the rod is received inside the crown spring, wherein the rod is engaged with the crown spring in a friction fit that holds the rod within the crown spring and within the tube while also allowing the rod to slide within the crown spring, wherein the rod has a first diameter toward the proximal end and a second diameter toward the distal end that is greater than the first diameter, wherein a shoulder is defined between the first and second diameters; and a coil spring surrounding the tube and trapped between the base and the shoulder on the rod, wherein the coil spring tends to push the distal end of the rod away from the base.

23. A battery testing apparatus that holds a battery and engages a pair of battery terminals on the battery for determining performance characteristics of the battery, comprising:

first and second battery test contacts for operatively engaging the pair of battery terminals, wherein at least one of the first and second battery test contacts comprises the electrical contact device of claim 22.

24. The battery testing apparatus of claim 23, wherein the base of the electrical contact device is a printed circuit board.

25. The battery testing apparatus of claim 24, wherein the rod has a bore extending through its length, further comprising a voltage probe received in the bore.

26. The battery testing apparatus of claim 25, wherein the rod is a current probe, further comprising a contact sheet fixed to the distal portion of the rod, wherein the contact sheet has fingerlike projections that are bent over the rod adjacent to the distal end of the rod for providing a plurality of points for electrical contact between the current probe and a battery terminal.

27. A battery testing contact assembly, comprising:

a support base having a hole;

a bolt received in the hole, wherein the bolt has upper and lower ends and a longitudinal bore, and wherein the bolt has an inside shoulder that protrudes into the bore near the lower end;

a coil spring received in the longitudinal bore of the bolt, wherein the coil spring abuts the inside shoulder, an elongate current probe having an upper end, an upper portion, a lower end and a lower portion, wherein the upper portion has a diameter that is greater than the diameter of the lower portion, wherein a probe shoulder is defined at the interface of the upper and lower portions, wherein the lower portion is received inside the coil spring, wherein the coil spring abuts the probe shoulder, wherein the coil spring is trapped between the inside shoulder of the bolt and the probe shoulder of the current probe;

a nut fixed to the bolt that fastens the bolt to the support base; and a contact sheet having a base portion and a plurality of fingerlike projections extending from the base portion, wherein the base portion of the contact sheet is fixed to and electrically connected with the upper portion of the current probe, and wherein the plurality of fingerlike projections extend over and partially cover the upper end of the current probe.

28. The battery testing contact assembly of claim 27, wherein the fingerlike projections are spaced apart from the upper end of the current probe, and wherein the fingerlike projections have bends at least one of which is toward the upper end and at least one of which is away from the upper end of the current probe.

29. The battery testing contact assembly of claim 27, wherein the current probe has a longitudinal bore, further comprising a voltage probe received in the longitudinal bore of the current probe.

\* \* \* \* \*